United States Patent [19]
Harrison et al.

[11] Patent Number: 5,920,518
[45] Date of Patent: *Jul. 6, 1999

[54] SYNCHRONOUS CLOCK GENERATOR INCLUDING DELAY-LOCKED LOOP

[75] Inventors: Ronnie M. Harrison; Brent Keeth, both of Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/799,661

[22] Filed: Feb. 11, 1997

[51] Int. Cl.$^6$ ...................................................... G11C 7/10
[52] U.S. Cl. ......................... 365/233; 365/194; 327/155; 327/158
[58] Field of Search .................................... 365/233, 194, 365/189.05, 189.07; 327/155, 156, 158, 161

[56] References Cited

U.S. PATENT DOCUMENTS

| | | | |
|---|---|---|---|
| 3,633,174 | 1/1972 | Griffin | 340/172.5 |
| 4,077,016 | 2/1978 | Sanders et al. | 331/4 |
| 4,096,402 | 6/1978 | Schroeder et al. | 307/362 |
| 4,404,474 | 9/1983 | Dingwall | 307/260 |
| 4,511,846 | 4/1985 | Nagy et al. | 328/164 |
| 4,514,647 | 4/1985 | Shoji | 307/269 |
| 4,600,895 | 7/1986 | Landsman | 331/1 A |
| 4,638,187 | 1/1987 | Boler et al. | 307/451 |
| 4,687,951 | 8/1987 | McElroy | 307/269 |
| 4,773,085 | 9/1988 | Cordell | 375/120 |
| 4,789,796 | 12/1988 | Foss | 307/443 |
| 4,893,087 | 1/1990 | Davis | 328/14 |

(List continued on next page.)

FOREIGN PATENT DOCUMENTS

| | | |
|---|---|---|
| 0 295 515 A1 | 12/1988 | European Pat. Off. . |
| 0 406 786 A1 | 1/1991 | European Pat. Off. . |
| 0 450 871 A2 | 10/1991 | European Pat. Off. . |
| 0 476 585 A2 | 3/1992 | European Pat. Off. . |
| 0 655 741 A2 | 5/1995 | European Pat. Off. . |
| 0 655 834 A1 | 5/1995 | European Pat. Off. . |
| 0 680 049 A2 | 11/1995 | European Pat. Off. . |
| 0 703 663 A1 | 3/1996 | European Pat. Off. . |

(List continued on next page.)

OTHER PUBLICATIONS

Descriptive literature entitled, "400 MHz SLDRAM, 4M×16 SLDRAM Pipelined, Eight Bank, 2.5 V Operation," pp. 1–22.

"Draft Standard for a High–Speed Memory Interface (SyncLink)," Microprocessor and Microcomputer Standards Subcommittee of the IEEE Computer Society, Copyright 1996 by the Institute of Electrical and Electronics Engineers, Inc., New York, NY, pp. 1–56.

Alvarez, J. et al., "A Wide–Bandwidth Low–Voltage PLL for PowerPC™ Microprocessors", IEEE IEICE Trans. Electron., vol. E78–C, No. 6, Jun. 1995, pp. 631–639.

Saeki, T. et al., "A 2.5–ns Clock Access, 250–MHz, 256–Mb SDRAM with Synchronous Mirror Delay", IEEE Journal of Solid–State Circuits, vol. 31, No. 11, Nov. 1996, pp. 1656–1665.

(List continued on next page.)

Primary Examiner—Son T. Dinh
Attorney, Agent, or Firm—Seed and Berry LLP

[57] ABSTRACT

A data and command latching circuit includes a delay-locked loop driven by a continuous reference clock signal that generates a delayed output clock signal having a delay controlled by the delay-locked loop. The latching circuit also includes a variable delay circuit external to the delay-locked loop that is driven by a discontinuous reference clock signal. Delay of the external delay circuit is controlled by a control voltage output from the delay-locked loop, so that the delays of the external delay circuit are determined with reference to the continuous reference clock signal. The delayed clock signals from the delay-locked loop activate control data latches to latch control data arriving at the latch circuit. The delayed signals from the variable voltage circuit activate data latches to latch data arriving at the latch circuit.

10 Claims, 5 Drawing Sheets

U.S. PATENT DOCUMENTS

| | | | |
|---|---|---|---|
| 4,902,986 | 2/1990 | Lesmeister | 331/25 |
| 4,958,088 | 9/1990 | Farah-Bakhsh et al. | 307/443 |
| 4,984,204 | 1/1991 | Sato et al. | 365/189.11 |
| 5,020,023 | 5/1991 | Smith | 364/900 |
| 5,038,115 | 8/1991 | Myers et al. | 331/2 |
| 5,086,500 | 2/1992 | Greub | 395/550 |
| 5,087,828 | 2/1992 | Sato et al. | 307/269 |
| 5,122,690 | 6/1992 | Bianchi | 307/475 |
| 5,128,560 | 7/1992 | Chern et al. | 307/475 |
| 5,128,563 | 7/1992 | Hush et al. | 307/482 |
| 5,134,311 | 7/1992 | Biber et al. | 307/270 |
| 5,150,186 | 9/1992 | Pinney et al. | 357/42 |
| 5,165,046 | 11/1992 | Hesson | 307/270 |
| 5,179,298 | 1/1993 | Hirano et al. | 307/443 |
| 5,194,765 | 3/1993 | Dunlop et al. | 307/443 |
| 5,220,208 | 6/1993 | Schenck | 307/443 |
| 5,239,206 | 8/1993 | Yanai | 307/272.2 |
| 5,243,703 | 9/1993 | Farmwald et al. | 395/325 |
| 5,254,883 | 10/1993 | Horowitz et al. | 307/443 |
| 5,256,989 | 10/1993 | Parker et al. | 331/1 A |
| 5,257,294 | 10/1993 | Pinto et al. | 375/120 |
| 5,268,639 | 12/1993 | Gasbarro et al. | 324/158 R |
| 5,274,276 | 12/1993 | Casper et al. | 307/443 |
| 5,276,642 | 1/1994 | Lee | 365/189.04 |
| 5,278,460 | 1/1994 | Casper | 307/296.5 |
| 5,281,865 | 1/1994 | Yamashita et al. | 307/279 |
| 5,283,631 | 2/1994 | Koerner et al. | 307/451 |
| 5,295,164 | 3/1994 | Yamamura | 375/120 |
| 5,311,481 | 5/1994 | Casper et al. | 365/230.06 |
| 5,321,368 | 6/1994 | Hoelzle | 328/63 |
| 5,337,285 | 8/1994 | Ware et al. | 365/227 |
| 5,347,177 | 9/1994 | Lipp | 307/443 |
| 5,347,179 | 9/1994 | Casper et al. | 307/451 |
| 5,355,391 | 10/1994 | Horowitz et al. | 375/36 |
| 5,361,002 | 11/1994 | Casper | 327/530 |
| 5,390,308 | 2/1995 | Ware et al. | 395/400 |
| 5,400,283 | 3/1995 | Raad | 365/203 |
| 5,408,640 | 4/1995 | MacIntyre et al. | 395/550 |
| 5,416,436 | 5/1995 | Rainard | 327/270 |
| 5,420,544 | 5/1995 | Ishibashi | 331/11 |
| 5,428,311 | 6/1995 | McClure | 327/276 |
| 5,430,676 | 7/1995 | Ware et al. | 365/189.02 |
| 5,432,823 | 7/1995 | Gasbarro et al. | 375/356 |
| 5,438,545 | 8/1995 | Sim | 365/189.05 |
| 5,440,260 | 8/1995 | Hayashi et al. | 327/278 |
| 5,440,514 | 8/1995 | Flannagan et al. | 365/194 |
| 5,444,667 | 8/1995 | Obara | 365/194 |
| 5,446,696 | 8/1995 | Ware et al. | 365/222 |
| 5,448,193 | 9/1995 | Baumert et al. | 327/156 |
| 5,451,898 | 9/1995 | Johnson | 327/563 |
| 5,457,407 | 10/1995 | Shu et al. | 326/30 |
| 5,473,274 | 12/1995 | Reilly et al. | 237/159 |
| 5,473,575 | 12/1995 | Farmwald et al. | 365/230.06 |
| 5,473,639 | 12/1995 | Lee et al. | 375/376 |
| 5,485,490 | 1/1996 | Leung et al. | 375/371 |
| 5,488,321 | 1/1996 | Johnson | 327/66 |
| 5,497,127 | 3/1996 | Sauer | 331/17 |
| 5,498,990 | 3/1996 | Leung et al. | 327/323 |
| 5,506,814 | 4/1996 | Hush et al. | 365/230.03 |
| 5,508,638 | 4/1996 | Cowles et al. | 326/38 |
| 5,513,327 | 4/1996 | Farmwald et al. | 395/309 |
| 5,539,345 | 7/1996 | Hawkins | 327/150 |
| 5,552,727 | 9/1996 | Nakao | 327/159 |
| 5,557,224 | 9/1996 | Wright et al. | 327/156 |
| 5,568,077 | 10/1996 | Sato et al. | 327/199 |
| 5,572,557 | 11/1996 | Aoki | 375/376 |
| 5,574,698 | 11/1996 | Raad | 365/230.06 |
| 5,576,645 | 11/1996 | Farwell | 327/94 |
| 5,577,236 | 11/1996 | Johnson et al. | 395/551 |
| 5,578,940 | 11/1996 | Dillon | 326/30 |
| 5,578,941 | 11/1996 | Sher et al. | 326/34 |
| 5,579,326 | 11/1996 | McClure | 371/61 |
| 5,581,197 | 12/1996 | Motley et al. | 326/30 |
| 5,589,788 | 12/1996 | Goto | 327/276 |
| 5,590,073 | 12/1996 | Arakawa et al. | 365/185.08 |
| 5,594,690 | 1/1997 | Rothenberger et al. | 365/189.01 |
| 5,614,855 | 3/1997 | Lee et al. | 327/158 |
| 5,619,473 | 4/1997 | Hotta | 365/238.5 |
| 5,621,340 | 4/1997 | Lee et al. | 327/65 |
| 5,621,690 | 4/1997 | Jungroth et al. | 365/200 |
| 5,621,739 | 4/1997 | Sine et al. | 371/22.1 |
| 5,627,780 | 5/1997 | Malhi | 365/185.09 |
| 5,627,791 | 5/1997 | Wright et al. | 365/222 |
| 5,631,872 | 5/1997 | Naritake et al. | 365/227 |
| 5,636,163 | 6/1997 | Furutani et al. | 365/189.01 |
| 5,636,173 | 6/1997 | Schaefer | 365/230.03 |
| 5,636,174 | 6/1997 | Rao | 365/230.03 |
| 5,638,335 | 6/1997 | Akiyama et al. | 365/230.03 |
| 5,657,481 | 8/1997 | Farmwald et al. | 395/551 |
| 5,663,921 | 9/1997 | Pascucci et al. | 365/233 |
| 5,668,763 | 9/1997 | Fujioka et al. | 365/200 |
| 5,692,165 | 11/1997 | Jeddeloh et al. | 395/551 |
| 5,694,065 | 12/1997 | Hamasaki et al. | 327/108 |
| 5,712,580 | 1/1998 | Baumgartner et al. | 327/12 |
| 5,751,665 | 5/1998 | Tanoi | 368/120 |

FOREIGN PATENT DOCUMENTS

| | | |
|---|---|---|
| 0 704 848 A2 | 4/1996 | European Pat. Off. . |
| 0 704 975 A1 | 4/1996 | European Pat. Off. . |
| 0 767 538 A1 | 4/1997 | European Pat. Off. . |
| 61-237512 | 10/1986 | Japan . |
| 2-112317 | 4/1990 | Japan . |
| 4-135311 | 8/1992 | Japan . |
| 5-136664 | 6/1993 | Japan . |
| 5-282868 | 10/1993 | Japan . |
| 7-319577 | 12/1995 | Japan . |
| WO 94/29871 | 12/1994 | WIPO G11C 7/00 |
| WO 95/22200 | 8/1995 | WIPO H03H 11/20 |
| WO 95/22206 | 8/1995 | WIPO H03L 7/081 |
| WO 96/10866 | 4/1996 | WIPO . |
| WO 97/14289 | 4/1997 | WIPO . |
| WO 97/42557 | 11/1997 | WIPO . |

OTHER PUBLICATIONS

Goto, J. et al., "A PLL–Based Programmable Clock Generator with 50–to 350–MHz Oscillating Range for Video Signal Processors", IEICE Trans. Electron., vol. E77–C, No. 12, Dec. 1994, pp. 1951–1956.

Soyuer, M. et al., "A Fully Monolithic 1.25GHz CMOS Frequency Synthesizer", IEEE Symposium on VLSI Circuits Digest of Technical Papers, 1994, pp. 127–128.

Kim, B. et al., "A 30MHz High–Speed Analog/Digital PLL in $2\mu m$ CMOS", ISSCC, Feb. 1990.

Christiansen, J., "An Integrated High Resolution CMOS Timing Generator Based on an Array of Delay Locked Loops", IEEE Journal of Solid–State Circuits, vol. 31, No. 7, Jul. 1996, pp. 952–957.

Watson, R. et al., "Clock Buffer Chip with Absolute Delay Regulation Over Process and Environmental Variations", IEEE Custom Integrated Circuits Conference, 1992, pp. 25.2.1–25.2.5.

Sidiropoulos, S. et al., "A CMOS 500 Mbps/pin synchronous point to point link interface", IEEE Symposium on VLSI Circuits Digest of Technical Papers, 1994, pp. 43–44.

Ishibashi, A. et al., "High–Speed Clock Distribution Architecture Employing PLL for $0.6\mu m$ CMOS SOG", IEEE Custom Integrated Circuits Conference, 1992, pp. 27.6.1–27.6.4.

Ko, U. et al., "A 30–ps Jitter, 3–6–µs Locking, 3.3–Volt Digital PLL for CMOS Gate Arrays", IEEE Custom Integrated Circuits Conference, 1993, pp. 23.3.1–23.3.4.

Novof, I. et al., "Fully Integrated CMOS Phase–Locked Loop with 15 to 240 MHz Locking Range and ±50ps Jitter", IEEE Journal of Solid–State Circuits, vol. 30, No. 11, Nov. 1995, pp. 1259–1266.

Lesmeister, G., "A Densely Integrated High Performance CMOS Tester", International Test Conference, Paper 16.2, 1991, pp. 426–429.

S. Sidiropoulos and M. Horowitz, "A Semi–Digital DLL with Unlimited Phase Shift Capability and 0.08–400 MHz Operating Range", ISSCC 1997, Paper No. SA 20.2, pp. 332–333.

J. Cho, "Digitally–Controlled PLL with Pulse Width Detection Mechanism for Error Correction", ISSCC 1997, Paper No. SA 20.3, pp. 334–335.

A. Aviram et al., "Obtaining High Speed Printing on Thermal Sensitive Special Paper with a Resistive Ribbon Print Head", IBM Technical Disclosure Bulletin, vol. 27, No. 5, Oct. 1984, pp. 3059–3060.

Shirotori, T. et al., "PLL–based, Impedance Controlled Output Buffer", 1991 Symposium on VLSI Circuits Digest of Technical Papers, pp. 49–50.

Tanoi, S. et al., "A 250–622MHz Deskew and Jitter–Suppressed Clock Buffer Using a Frequency–and Delay–Locked Two–Loop Architecture", 1995 Symposium on VLSI Circuits Digest of Technical Papers, vol. 11, No. 2, pp. 85–86.

Maneatis, J., "Low–Jitter Process–Independent DLL and PLL Based on Self–Biased Techniques", IEEE Journal of Solid–State Circuits, vol. 31, No. 11, Nov. 1996, pp. 1723–1732.

von Kaenel, V. et al., "A 320 MHz, 1.5 mW @ V CMOS PLL for Microprocessor Clock Generation", IEEE Journal of Solid–State Circuits, vol. 31, No. 11, Nov. 1996, pp. 1715–1722.

Combes, M. et al., "A Portable Clock Multiplier Generator Using Digital CMOS Standard Cells", IEEE Journal of Solid–State Circuits, vol. 31, No. 7, Jul. 1996, pp. 958–965.

Lee, T. et al., "A 2.5V Delay–Locked Loop for an 18Mb 500MB/s DRAM", IEEE International Solid–State Circuits Conference Digest of Technical Papers, Paper No. FA 18.6, 1994, pp. 300–301.

Santos, D. et al., "A CMOS Delay Locked Loop And Sub–Nanosecond Time–to–Digital Converter Chip", IEEE Nuclear Science Symposium and Medical Imaging Conference Record, vol. 1, Oct. 1995, pp. 289–291.

Ljuslin, C. et al., "An Integrated 16–channel CMOS Time to Digital Converter", IEEE Nuclear Science Symposium & Medical Imaging Conference Record, vol. 1, 1993, pp. 625–629.

Chapman, J. et al., "A Low–Cost High–Performance CMOS Timing Vernier for ATE", IEEE International Test Conference, Paper 21.2, 1995, pp. 459–468.

Tanoi, S. et al., "A 250–622 MHz Deskew and Jitter–Suppressed Clock Buffer Using Two–Loop Architecture", IEEE IEICE Trans. Electron., vol. E79–C, No. 7, Jul. 1996, pp. 898–904.

Nakamura, M. et al., "A 156 Mbps CMOS Clock Recovery Circuit for Burst–mode Transmission", Symposium on VLSI Circuits Digest of Technical Papers, 1996, pp. 122–123.

Yoshimura, T. et al., "A 622–Mb/s Bit/Frame Synchronizer for High–Speed Backplane Data Communication", IEEE Journal of Solid–State Circuits, vol. 31, No. 7, Jul. 1996, pp. 1063–1066.

Kikuchi, S. et al., "A Gate–Array–Based 666MHz VLSI Test System", IEEE International Test Conference, Paper 21.1, 1995, pp. 451–458.

Nielson, E., "Inverting latches make simple VCO", EDN, Jun. 19, 1997.

Sidiropoulos, S. et al., "A 700–Mb/s/pin CMOS Signaling Interface Using Current Integrating Receivers", IEEE Journal of Solid–State Circuits, vol. 32, No. 5, May 1997, pp. 681–690.

Yasuo Arai, Member IEEE, Tsuneo Matsumura, Member, IEEE, and Ken–ichi Endo, "A CMOS Four–Channel x 1K Time Memory LSI with 1–ns/b Resolution", IEEE Journal of Solid–State Circuits, vol. 27, No. 3, M;8107 IEEE Journal of Solid–State Circuits 27(1992)Mar., No. 3, New York, US.

Yasuo Arai, Member, IEEE, and Masahiro Ikeno, "A Time Digitizer CMOS Gate–Array with a 250 ps Time Resolution", XP 000597207, IEEE Journal of Solid–State Circuits, vol. 31, No. 2, Feb. 1996.

Anonymous, "Programmable Pulse Generator", IBM Technical Disclosure Bulletin, vol. 17, No. 12, May 1975, pp. 3553–3554.

Anonymous, "Pulse Combining Network", IBM Technical Disclosure Bulletin, vol. 32, No. 12, May 1990, pp. 149–151.

Anonymous, "Variable Delay Digital Circuit", IBM Technical Disclosure Bulletin, vol. 35, No. 4A, Sep. 1992, pp. 365–366.

Bazes, M., "Two Novel Fully Complementary Self–Biased CMOS Differential Amplifiers", IEEE Journal of Solid–State Circuits, vol. 26, No. 2, Feb. 1991, pp. 165–168.

Donnelly, K. et al., "A 660 MB/s Interface Megacell Portable Circuit in 0.3 µm–0.7 µm CMOS ASIC", IEEE Journal of Solid–State Circuits, vol. 31, No. 12, Dec. 1996, pp. 1995–2001.

Hamamoto, T., 400–MHz Random Column Operating SDRAM Techniques with Self–Skew Compensation, IEEE Journal of Solid–State Circuits, vol. 33, No. 5, May 1998, pp. 770–778.

Taguchi, M. et al., "A 40–ns 64–Mb DRAM with 64–b Parallel Data Bus Architecture", IEEE Journal of Solid–State Circuits, vol. 26, No. 11, Nov. 1991, pp. 1493–1497.

SYNCHRONOUS CLOCK GENERATOR INCLUDING DELAY-LOCKED LOOP

TECHNICAL FIELD

The present invention relates to integrated circuit devices, and more particularly, to generation of clock signals in integrated circuit devices.

BACKGROUND OF THE INVENTION

Many high-speed integrated circuit devices, such as synchronous dynamic random access memories (SDRAM), rely upon clock signals to control the flow of commands, data, and addresses into, through, and out of the devices. Typically, operations are initiated at edges of the clock signals (i.e., transitions from high to low or low to high). To more precisely control the timing of operations within the device, each period of a clock signal is sometimes divided into subperiods so that certain operations do not begin until shortly after the clock edge.

One method for controlling the timing of operations within a period of a clock signal generates phase-delayed versions of the clock signal. For example, to divide the clock period into four subperiods, phase delayed versions are produced that lag the clock signal by 90°, 180° and 270°, respectively. Edges of the phase-delayed clock signals provide signal transitions at the beginning or end of each subperiod that can be used to initiate operations.

An example of such an approach is shown in FIGS. 1 and 2 where the timing of operations in a memory device 10 is defined by an externally provided reference control clock signal CCLKREF and an externally provided reference data clock signal DCLKREF. The reference clock signals CCLKREF, DCLKREF are generated in memory controller 11 and transmitted to the memory device 10 over a command clock bus and a data clock bus. The reference clock signals CCLKREF, DCLKREF have identical frequencies, although the reference control clock signal CCLKREF is a continuous signal and the reference data clock signal DCLKREF is a discontinuous signal, i.e., the reference data clock signal DCLKREF does not include a pulse for every clock period T, as shown in FIG. 2. Although the reference clock signals CCLKREF, DCLKREF have equal frequencies, they may be phase shifted by a lag time $T_L$ upon arrival at the memory device 10 due to differences in propagation times, such as may be produced by routing differences between the command clock bus and the data clock bus.

Control data CD1-CDN arrive at respective input terminals 12 substantially simultaneously with pulses of the reference control clock signal CCLKREF and are latched in respective control data latches 16. However, if the device attempts to latch the control data CD1-CDN immediately upon the edge of the reference clock signal CCLKREF, the control data may not have sufficient time to develop at the input terminal 12. For example, a voltage corresponding to a first logic state (e.g., a "0") at the input terminal 12 may not change to voltage corresponding to an opposite logic state (e.g., a "1") by the time the data are latched. To allow time for the control data CD1-CDN to develop fully at the input terminal 12, the control data are latched at a delayed time relative to the reference control clock signal CCLKREF. To provide a clock edge to trigger latching of the commands CD1-CDN at the delayed time $t_1$, a delay circuit 18 delays the reference clock signal CCLKREF by a delay time $T_{D1}$ to produce a first delayed clock signal CCLKD. Edges of the first delayed clock signal CCLKD activate the control data latches to latch the control data CD1-CDN at time $t_1$.

Data DA1-DAM arrive at the data terminals 14 substantially simultaneously with the reference data clock signal DCLKREF, as shown in the fourth and fifth graphs of FIG. 2. Respective data latches 20 latch the data DA1-DAM. As with the control data CD1-CDN, it is desirable that the data DA1-DAM be latched with a slight delay relative to transitions of the reference data clock DCLKREF to allow time for signal development at the data terminals 14. To provide a delayed clock edge, a delay block 22 delays the reference data clock signal DCLKREF to produce a phase-delayed data clock DCLK1 that is delayed relative to the reference data clock signal DCLKREF by the delay time $T_{D1}$.

For latching both control data CD1-CDN and data DA1-DAM, it is often desirable to allow some adjustment of the phase delay. For example, if the clock frequencies change, the duration of the subperiods will change correspondingly. Consequently, the delayed clocks CCLKD, DCLKD may not allow sufficient signal development time before latching the control data or data. Also, variations in transmission times of control data, data, or clock signals may cause shifts in arrival times of control data CD1-CDN or data DA1-DAM relative to the clock signals CCLKREF, DCLKREF of the memory device.

One possible approach to producing a variable delay control clock CCLKD employs a delay-locked loop 38 driven by the reference command clock CCLKREF, as shown in FIG. 3. The reference control clock signal CCLKREF is input to a conventional multiple output variable delay circuit 40 such as that described in Maneatis, "Low-Jitter Process-Independent DLL and PLL Based on Self-Biased Techniques," *IEEE Journal of Solid-State Circuits* 31(11):1723–1732, November 1996. The delay circuit 40 is a known circuit that outputs multiple delayed signals CCLK1-CCLKN with increasing lags relative to the reference signal CCLKREF. The delays of the signals CCLK1-CCLKN are variable responsive to a control signal $V_{CON}$ received at a control port 42.

A feedback circuit 44 formed from a comparator 46 and an integrator 48 produces the control signal $V_{CON}$. The feedback circuit 44 receives the reference control clock signal CCLKREF at one input of the comparator 46 and receives one of the output signals CCLKN from the delay circuit 40 as a feedback signal at the other input of the comparator 46. The comparator 46 then outputs a compare signal $V_{COMP}$ that is integrated by the integrator 48 to produce the control signal $V_{CON}$.

As is known, the control signal VCON will depend upon the relative phases of the reference control clock signal CCLKREF and the feedback signal CCLKN. If the feedback signal CCLKN leads the reference control clock signal CCLKREF, the control signal $V_{CON}$ increases the delay of the delay circuit 40, thereby reducing the magnitude of the control signal $V_{CON}$ until the feedback signal CCLKN is in phase with the reference signal CCLKREF. Similarly, if the feedback signal CCLK lags the reference signal CCLKREF, the control signal $V_{CON}$ causes the delay circuit 40 to decrease the delay until the feedback voltage CCLKN is in phase with the reference voltage CCLKREF.

A similar delay-locked loop 50 produces the delayed data clock signals DCLK1-DCLKN in response to the reference data clock signal DCLKREF. However, unlike the reference control clock signal CCLKREF, the reference data clock signal DCLKREF is discontinuous. Typically, the reference data clock signal DCLKREF arrives in bursts of clock pulses as a block of data is accessed. Between bursts, the reference data clock signal DCLKREF is relatively inactive such that the delay-locked loop 50 may lose its lock. Consequently, when bursts arrive, the delays of the delayed data clocks DCLK1-DCLKN may not be properly adjusted by the delay-locked loop 50 and the data DA1-DAM may have insufficient or excessive development time at the data bus before latching.

SUMMARY OF THE INVENTION

A high-speed memory device includes a clock generator that generates a plurality of clock signals in response to a reference clock signal at a reference frequency and a secondary clock signal at a secondary frequency substantially equal to the reference frequency. A first set of the clock signals is produced by a delay-locked loop in response to the reference clock signal. A delay block in the delay-locked loop receives the reference clock signal and produces a plurality of phase delayed signals at the clock frequency. One of the phase delayed signals is fed back to a comparator where the feedback signal is compared to the reference clock signal. The output of the comparator is then filtered and applied to a control input of the delay block to adjust the delay of the delay block. The delay-locked loop thus produces a plurality of output signals having fixed phases relative to the reference clock signal.

In addition to the delay-locked loop, the clock generator also includes a secondary delay block having a clock input fed by the secondary clock signal. The control input of the secondary delay block receives the control signal from the comparator, such that the comparator output controls both of the delay blocks. The secondary delay block outputs a plurality of secondary delayed signals each having a respective delay relative to the secondary clock signal. By controlling the variable delays of the secondary delayed signals with the output of the delay-locked loop driven by the reference clock signal, the secondary delay signals can remain delay-locked even though the secondary clock signal is a discontinuous data clock signal.

DETAILED DESCRIPTION OF THE INVENTION

Figure 4:
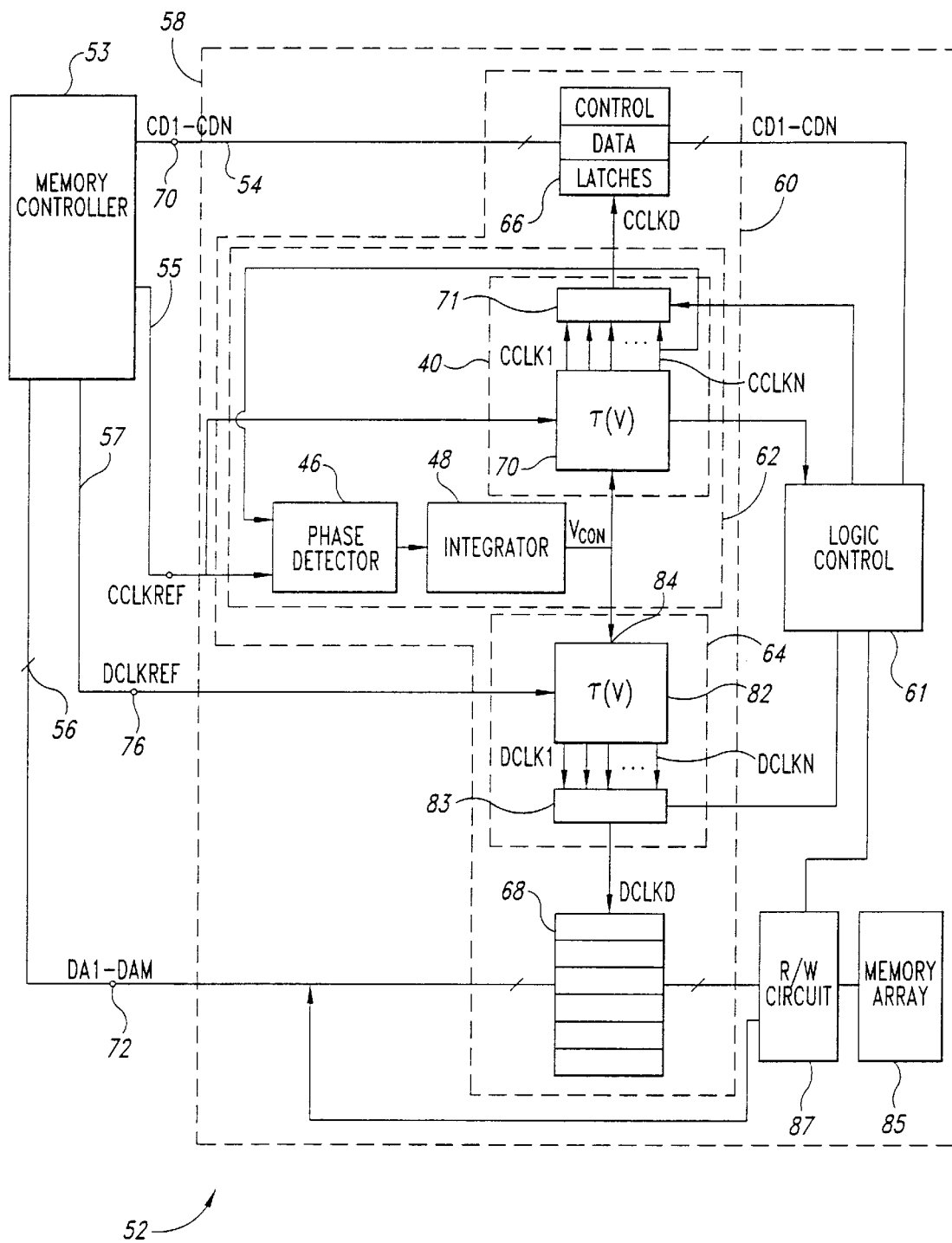
FIG. 4 is a block diagram of a memory system according to the invention, including a memory device having a clock generator circuit where a delay-locked loop generates command clock signals in response to a reference clock signal and a variable delay block coupled to the delay-locked loop generates data clock signals in response to a reference data clock signal.

As shown in FIG. 4, a memory system 52 includes a memory device 58 that operates under control of a memory controller 53. The memory controller 53 controls the memory device 58 through control data CD1-CDN and a reference clock signal CCLKREF, carried by a control data bus 54 and a clock bus 55, respectively. The memory controller 53 provides data DA1-DAM to the memory device 58, synchronously with a data clock signal DCLKREF over a data bus 56 and a data clock bus 57, respectively.

The memory device 58 includes a latching circuit 60 that operates under control of a logic control circuit 61. The latching circuit 60 is formed from a delay-locked loop 62, a variable slave delay circuit 64, control data latches 66, and data latches 68. The control data latches 66 receive control data CD1-CDN from the control data bus 54 and the data latches 68 receive data DA1-DAM on the data bus 56. Additionally, the latching circuit 60 receives the reference control clock signal CCLKREF and the reference data clock signal DCLKREF from the respective clock buses 55, 57.

As discussed above, the reference control clock signal CCLKREF is a continuous clock signal that drives the delay-locked loop 62 at a frequency $f_{CCLK}$. Like the delay locked loop 38 described above with reference to FIG. 3, the delay-locked loop 62 is formed from the variable delay circuit 40, comparator 46, and integrator 48. The variable delay circuit 40 is formed from a multitap variable delay line 70 of conventional construction and a selector switch 71. The delay circuit 40 provides several delayed clock signals CCLK1-CCLKN, each at the frequency $f_{CCLK}$ and each delayed by a respective time delay relative to the reference control clock signal CCLKREF. The selector switch 71, under control of the logic control circuit 61, couples one of the outputs of the variable delay line 70 to the control data latches form the delayed reference clock signal CCLKD. The logic controller 61 selects the switch position to select a delayed clock signal CCLK1-CCLKN that has a pulse delayed by approximately half of the data clock period relative to the control clock CCLKREF as the delayed clock signal CCLKD. The logic controller 61 is able to vary the switch position to accommodate changes in clock period that may occur as a result of operating frequency changes. As discussed above, the delayed reference clock signal CCLKD activates the control data latches 66, thereby latching control data CD1-CDN. The latched control data CD1-CDN is then made available to the logic control circuit 61.

Figure 1:
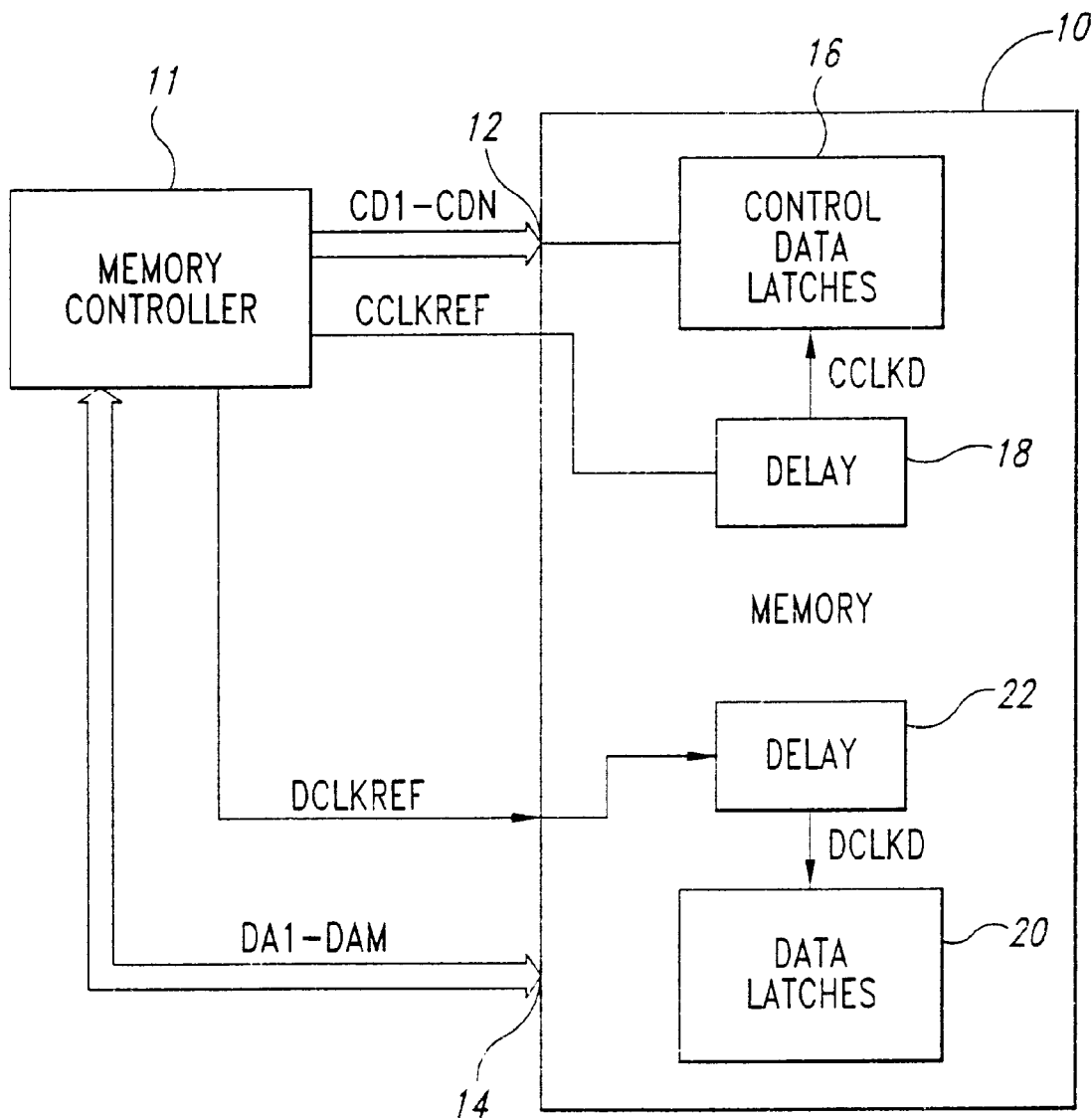
FIG. 1 is a block diagram of a prior art memory system including a memory device and memory controller linked by control data and data buses.
Figure 2:
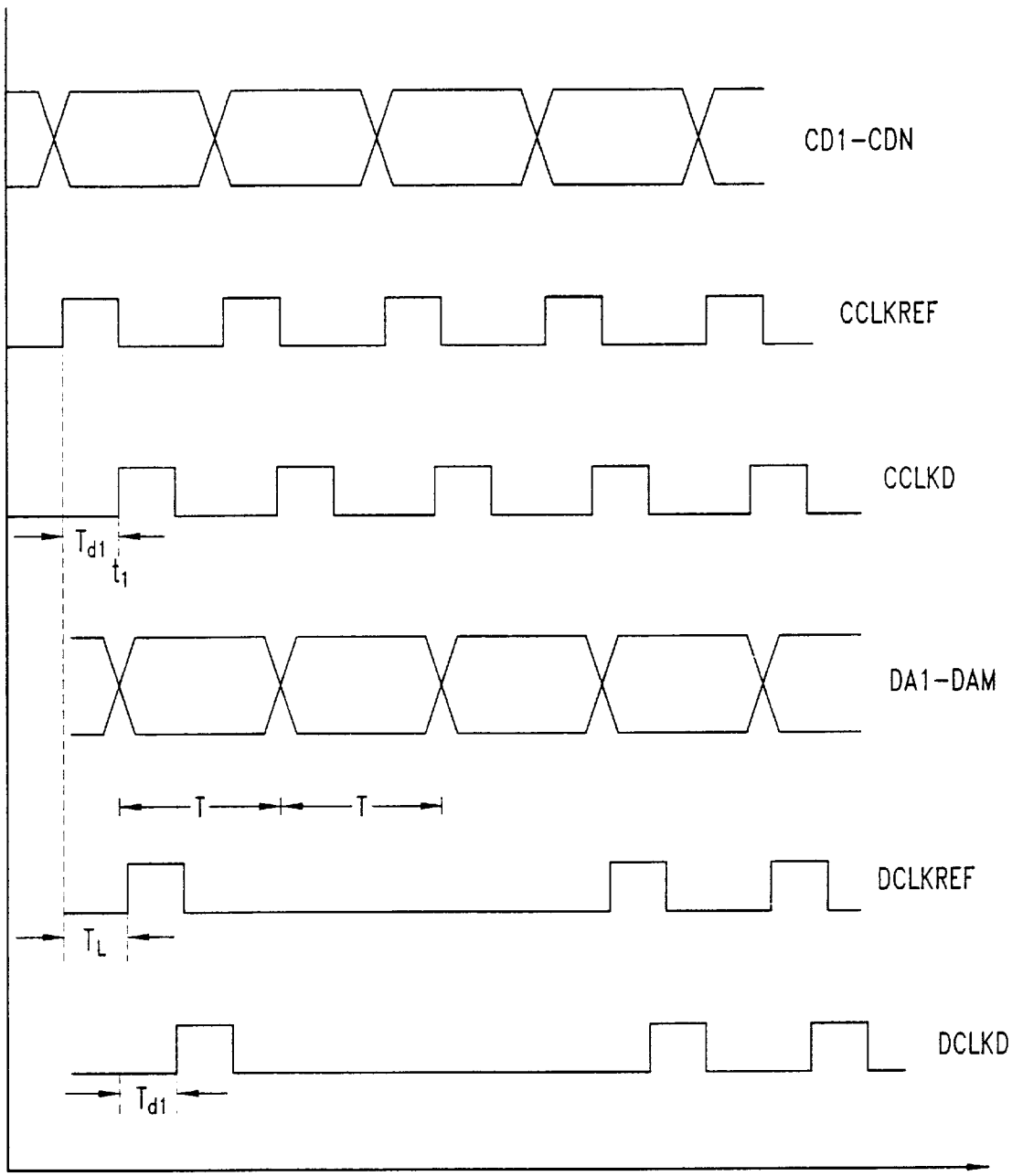
FIG. 2 is a signal timing diagram showing timing of commands, data, and clock signals in the memory system of FIG. 1.
Figure 3:
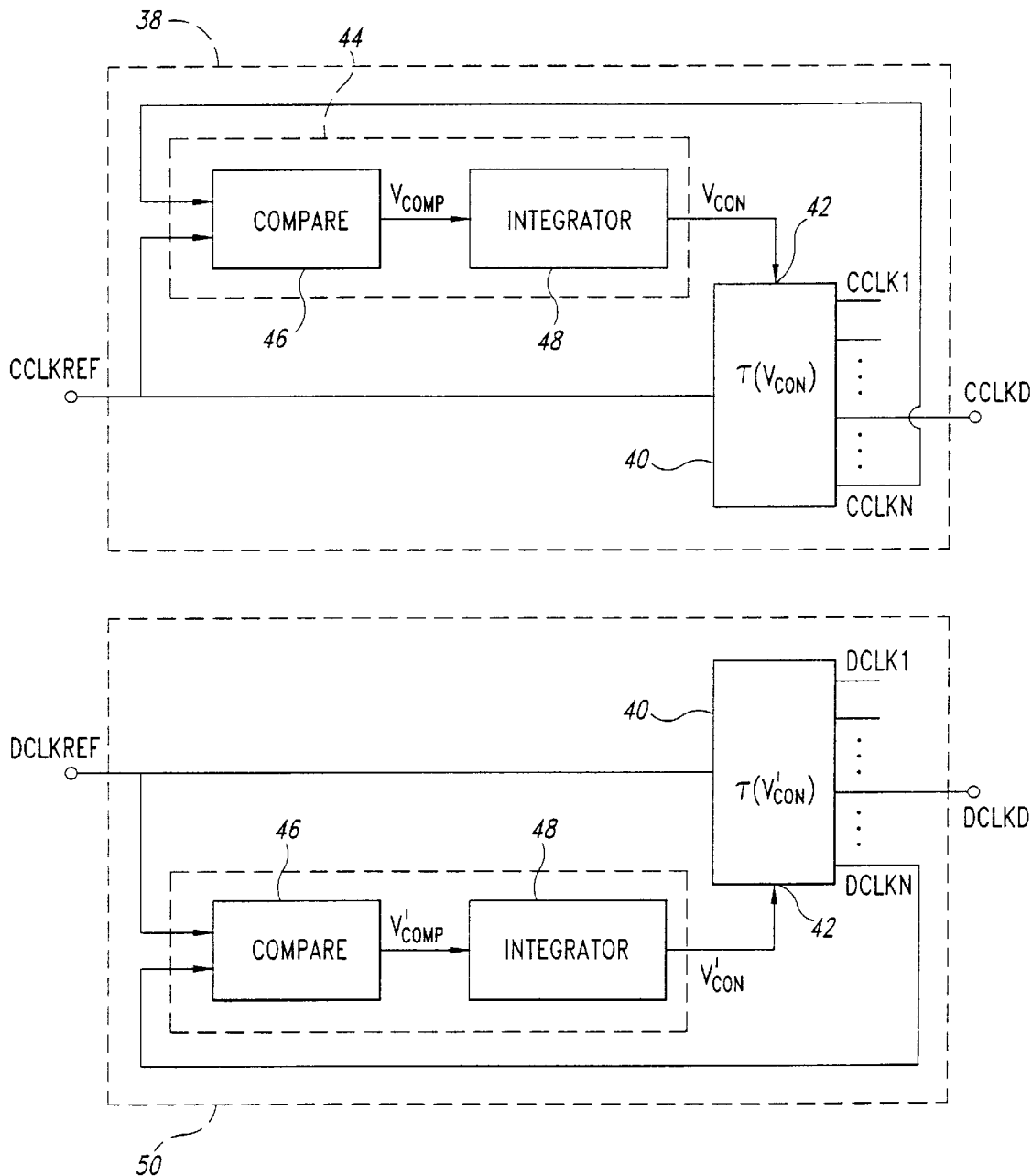
FIG. 3 is a block diagram of a pair of delay-locked loops separately driven by control and data reference clock signals according to prior art.

Unlike the circuit of FIG. 3, the latching circuit 60 of FIG. 4 does not employ a second delay-locked loop to produce the delayed data clock signal DCLKD. Instead, the reference data clock signal DCLKREF drives a slave delay circuit 64 formed from a second variable delay line 82 and a second selector switch 83. The delay of the second delay line 82 is controlled by applying the control signal $V_{CON}$ from the integrator 48 to the control input 84 of the second delay line 82. The overall delay of the second delay line 82 is substantially equal to that of the variable delay line 70 of the delay-locked loop 62. However, the number of subperiods may differ between the delay lines 70, 82. The second selection switch 83 couples one of the delayed data clock signals DCLK1-DCLKN to the data latches 68 to produce the delayed data clock DCLKD, which is delayed relative to the data clock DCLKREF by the delay time $T_{D1}$. The delayed data clock DCLKD activates the latches 68, thereby latching data DA1-DAM arriving at the input data bus 72. The latched data DA1-DAM is then made available by the latches 68 to a memory array 85 through read/write circuitry 87.

One skilled in the art will recognize that the latching circuit 60 takes advantage of the matching clock periods T of the reference clock CCLKREF and the reference data clock DCLKREF to eliminate the delay-locked loop 50 of FIG. 3. Because the delay time TD, of the delayed data clock DCLKD is controlled by the delay-locked loop 62 driven at the same frequency as the reference data clock DCLKREF, the delayed data clock DCLKD has a fixed phase relationship relative to the discontinuous reference data clock signal DCLKREF without requiring locking to the discontinuous reference data clock DCLKREF.

By eliminating the delay-locked loop 50 of FIG. 3 and establishing the delay time $T_{D1}$ with reference to the reference clock signal CCLKREF, the memory system 52 establishes the delay time $T_{D1}$ with reference to a continuous signal (CCLKREF) rather than a discontinuous signal (DCLKREF). Consequently, the memory system 52 provides a continuously controlled time delay $T_{D1}$ while eliminating the difficulties in attempting to lock the delay-locked loop 50 to the discontinuous data clock signal DCLKREF.

As noted above, the selector switches 71, 83 selectively couple the outputs of the variable delay circuits 40, 64 to the respective latches 66, 68. The positions of the selector switches 71, 83 are selected by the logic control circuit 61. Preferably, the selector switch position is programmed into the logic controller 61 when the memory device 58 is produced. However, where the memory device 58 may be used at more than one frequency or where the arrival times of data or commands may vary relative to their respective reference clocks CCLKREF, DCLKREF, the memory controller 53 may command the logic control circuit 61 to define a revised selection switch position. Thus, the use of a multi-tap variable delay line 70 in combination with the selector switches 71, 83 allows the memory device 58 to be "tuned" for varying operating conditions or frequencies.

Figure 5:
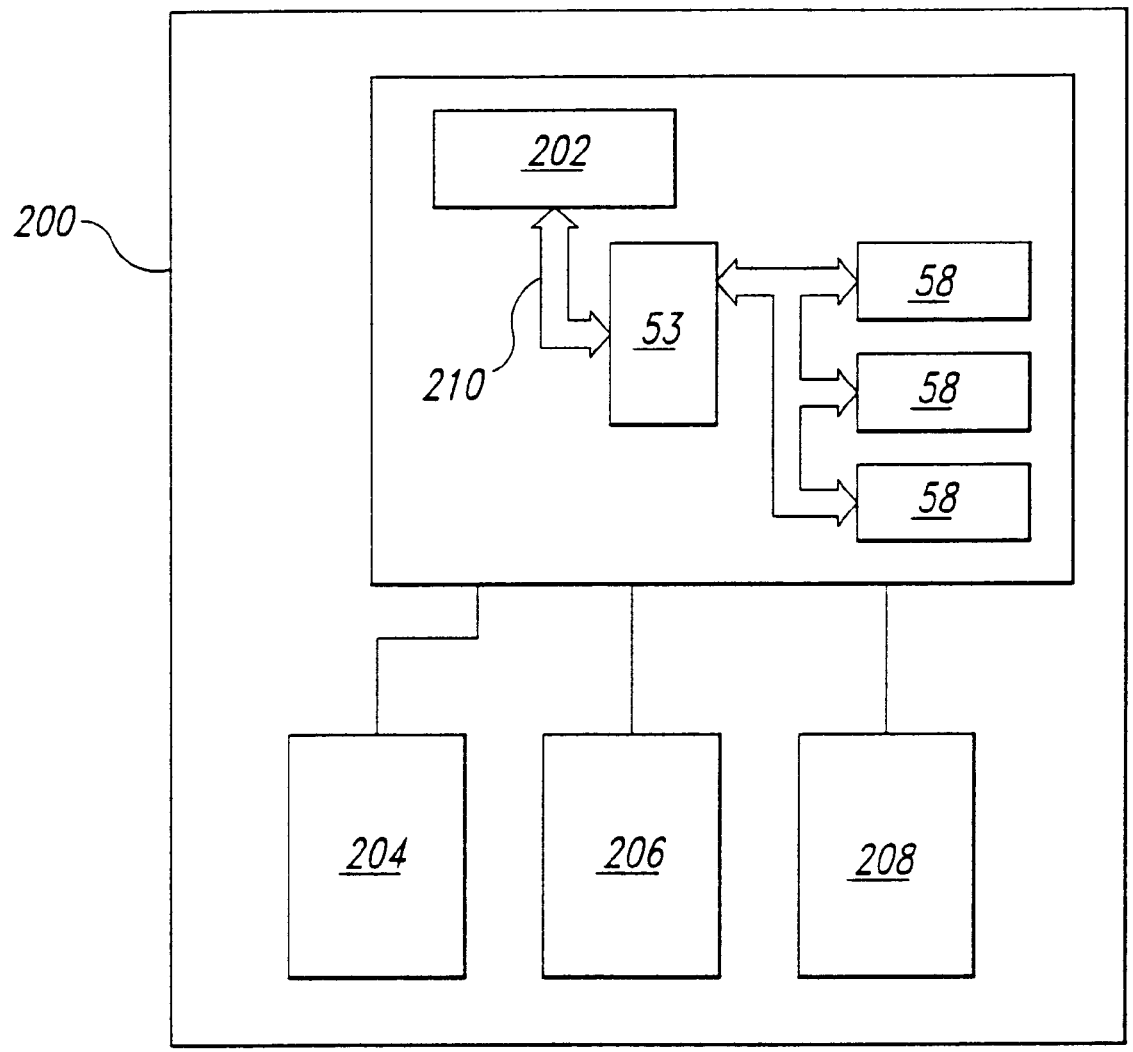
FIG. 5 is a block diagram of a computer system including the memory system of FIG. 4.

FIG. 5 is a block diagram of a computer system 200 that contains the memory controller 53 and three of the memory devices 58 of FIG. 4. The computer system 200 includes a processor 202 for performing computer functions such as executing software to perform desired calculations and tasks. The processor 202 also includes command, address and data buses 210 to activate the memory controller 53, thereby controlling reading from and writing to memory devices 58. One or more input devices 204, such as a keypad or a mouse, are coupled to the processor 202 and allow an operator to manually input data thereto. One or more output devices 206 are coupled to the processor 202 to display or otherwise output data generated by the processor 202. Examples of output devices include a printer and a video display unit. One or more data storage devices 208 are coupled to the processor to store data on or retrieve data from external storage media (not shown). Examples of storage devices 208 and storage media include drives that accept hard and floppy disks, tape cassettes and compact-disk read-only memories.

While the invention has been described herein by way of exemplary embodiments, various modifications may be made without departing from the spirit and scope of the invention. For example, although the computer system 200 of FIG. 5 contains only three memory devices 58, a larger or smaller number of memory devices 58 may be included within the computer system 200. Similarly, although the feedback portion of the delay-locked loop 62 is presented as containing only a comparator 46 and integrator 48, other circuitry may be used to control the variable delay lines 70, 82. Also, one skilled in the art will understand that other feedback elements may replace the comparator 46 and integrator 48. For example, the comparator 46 can be replaced by any know phase comparing or detecting circuit and the integrator 48 may be replaced by a conventional loop filter. Additionally, where the memory device 58 is operated such that control data and data are latched at a constant phase relative to the reference clocks CCLKREF, DCLKREF, the variable delay lines 70, 82 may have only one output. Also, although the combination of the delay-locked loop 62 and the additional variable delay block 82 are described herein as part of a latching circuit 60, a variety of other circuits may be developed incorporating this combination. Moreover, although the outputs of the variable delay lines 70, 82 are shown herein as driving the latches 66, 68, the outputs may also drive other circuitry in the memory device 58 to control timing of operations in addition to, or other than, latching. Further, although the exemplary embodiment described herein uses a delay locked loop 62 to lock to the reference clock signal CCLKREF, one skilled in the art could easily adapt the circuits described herein to employ a phase-locked loop for locking. Accordingly, the invention is not limited except as by the appended claims.

We claim:

1. A clock generator for generating a delayed secondary clock signal in response to a reference clock signal at a reference frequency and a secondary clock signal at a secondary frequency substantially equal to the reference frequency, comprising:

a delay-locked loop, including:

an reference clock terminal adapted to receive the reference clock signal;

a comparator having a first input coupled to the reference clock terminal and adapted to receive the reference clock signal, and a second input receiving a delayed clock signal, the comparator being responsive to the reference clock signal and the delayed clock signal to output a compare signal on an output terminal indicative of a relationship between the reference clock signal and the delayed clock signal; and a primary variable delay block having a primary control input coupled to the comparator output terminal, a primary clock input coupled to the reference clock terminal and a first delay output coupled to the second input of the comparator, the primary variable delay block producing the delayed clock signal responsive to the reference clock signal with a first primary delay that varies responsive to the compare signal at the primary control input;

a secondary clock terminal adapted to receive a secondary clock signal; and a secondary variable delay block having a secondary control input coupled to the comparator output terminal, a secondary clock input coupled to the secondary clock terminal, and a first secondary delay output, the secondary variable delay block producing a first secondary delayed signal, responsive to the secondary clock signal with a secondary delay that varies responsive to the compare signal at the secondary control input.

2. The clock generator of claim 1 wherein the primary variable delay block further includes a second delay output, the primary variable delay block having a second primary delay between the primary clock input and the second delay output that varies responsive to the compare signal at the primary control input, the second primary delay being different than the first primary delay.

3. The clock generator of claim 1 wherein the comparator includes a phase comparing circuit and an integrator.

4. The clock generator of claim 1 wherein the secondary variable delay block includes a second secondary delay output and wherein the secondary variable delay block is operative to provide a second secondary delay signal at the second secondary output, further including a selector switch having a switch output, a first input coupled to the first secondary delay output, and a second switch input coupled to the second secondary delay output.

5. A memory device adapted to receive data and commands at a reference frequency, the memory device comprising:

a data input terminal;

a command input terminal;

a primary delay-locked loop, including:
- a reference clock terminal adapted to receive a reference clock signal at the reference clock frequency;
- a comparator having a first input terminal coupled to the reference clock terminal and adapted to receive the reference clock signal, a second input receiving a delayed clock signal, and the comparator being responsive to output a compare signal indicative of a relationship between the reference clock signal received at the first input and the delayed clock signal received at the second input terminal; and
- a primary variable delay block having a primary control input coupled to the comparator output, a primary clock input terminal coupled to the reference clock terminal and a first delay output coupled to the second input terminal of the comparator, the primary variable delay block producing the delayed clock signal responsive to the reference clock signal with a primary delay that varies responsive to the compare signal at the primary control input;

a command latch having a clocking input coupled to a second delay output and a command input coupled to the command input terminal;

a secondary clock terminal adapted to receive a secondary clock signal at a secondary clock frequency;

a secondary delay block having a secondary control input terminal coupled to the comparator output, a secondary clock input coupled to the secondary clock terminal, and a secondary delay output, the secondary delay block producing a first secondary delayed signal at the secondary delay output at the secondary frequency with a secondary delay that varies responsive to the compare signal at the secondary control input; and a data latch having a data clocking input coupled to the first secondary delay output and a data input coupled to the data input terminal.

6. The memory device of claim 5 wherein the primary variable delay block further includes a second delay output that provides a second secondary delayed signal with a second primary delay between the primary clock input and the second delay output that varies responsive to the compare signal at the primary control input, the second primary delay being different than the first primary delay.

7. A latching circuit for latching data according to a discontinuous data clock signal having a clock frequency, comprising:

a data clock terminal adapted to receive the data clock signal;

a data terminal adapted to receive the data to be latched;

a reference clock source operative to produce a reference clock signal at the frequency of the discontinuous clock signal;

a delay locked loop having a reference signal input coupled to the reference clock source, a delay portion and a feedback portion, the feedback portion providing a feedback signal;

a slave delay line having a clock input coupled to the data clock terminal and a control input coupled to the feedback portion, the slave delay line having a first slave output and being responsive to provide a delayed data clock signal at the first slave output in response to the data clock signal and the feedback signal; and a data latch having a data input coupled to the data terminal and a clocking input coupled to the first slave output, the data latch being responsive to latch data in response to the delayed data clock signals.

8. The latching circuit of claim 7 wherein the slave delay line includes a second slave output, further comprising a selector switch coupled between the slave delay line and the data latch, the selector switch having a first switch input coupled to the first slave output, a second switch input coupled to the second slave output, and a switch output coupled to the clocking input of the data latch.

9. A method of latching commands and data in a memory device responsive to respective command clock signals and data clock respective clock frequencies and clock phases, the method comprising the steps of:

producing a delayed command clock signal in response to the command clock signal, the delayed command clock signal being delayed from the command clock signal by a command delay time;

producing a delayed data clock signal in response to the data clock signal, the delayed data cock signal being delayed from the data clock signal by a data delay time;

comparing a phase of the delayed command clock signal to the phase of the command clock signal;

in response to the step of comparing the phases, adjusting the command delay time to produce an adjusted delayed command clock signal;

in response to the step of comparing the phases, adjusting the data delay time to produce an adjusted delayed data clock signal; and latching the data in response to the adjusted delayed data clock signal.

10. The method of claim 9 wherein the step of producing a delayed data clock signal includes the step of providing the data clock signal to a delay line and the step of adjusting the data delay time includes adjusting delay of the delay line.

\* \* \* \* \*

UNITED STATES PATENT AND TRADEMARK OFFICE
CERTIFICATE OF CORRECTION

PATENT NO. : 5,920,518
DATED : July 6, 1999
INVENTOR(S) : Harrison et al.

It is certified that error appears in the above-identified patent and that said Letters Patent is hereby corrected as shown below:

Column 4, line 67     "TD,"     -- $T_{D1}$ --

Signed and Sealed this

Eighth Day of May, 2001

Attest:

NICHOLAS P. GODICI

Attesting Officer     Acting Director of the United States Patent and Trademark Office